(12) United States Patent
Kim et al.

(10) Patent No.: US 10,388,702 B2
(45) Date of Patent: Aug. 20, 2019

(54) ORGANIC LIGHT EMITTING DISPLAY DEVICE

(71) Applicant: LG Display Co., Ltd., Seoul (KR)

(72) Inventors: Dongyoung Kim, Anyang-si (KR); YongBaek Lee, Anyang-si (KR); Ho-Jin Kim, Seoul (KR); Goeun Jung, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 13 days.

(21) Appl. No.: 15/787,027

(22) Filed: Oct. 18, 2017

(65) Prior Publication Data

US 2018/0122868 A1 May 3, 2018

(30) Foreign Application Priority Data

Oct. 31, 2016 (KR) .................. 10-2016-0143780

(51) Int. Cl.
*H01L 27/32* (2006.01)
*H01L 51/52* (2006.01)

(52) U.S. Cl.
CPC ........ *H01L 27/3206* (2013.01); *H01L 27/322* (2013.01); *H01L 27/3244* (2013.01); *H01L 51/5237* (2013.01); *H01L 51/5253* (2013.01); *H01L 51/5256* (2013.01); *H01L 51/5265* (2013.01); *H01L 27/323* (2013.01); *H01L 27/3246* (2013.01); *H01L 51/5284* (2013.01)

(58) Field of Classification Search
CPC ............ H01L 51/0579; H01L 27/3206; H01L 51/5265; H01L 51/5284; H01L 51/5237; H01L 27/3244; H01L 27/322; H01L 27/323
See application file for complete search history.

(56) References Cited

U.S. PATENT DOCUMENTS

| | | | |
|---|---|---|---|
| 6,200,712 B1 * | 3/2001 | Fan .................. | G02B 5/201 257/E31.128 |
| 2007/0165158 A1 * | 7/2007 | Rho .................. | G02F 1/133514 349/106 |
| 2013/0021550 A1 * | 1/2013 | Watakabe ......... | G02F 1/133514 349/43 |
| 2017/0168608 A1 * | 6/2017 | Kim .................. | G06F 3/0412 |
| 2017/0194382 A1 * | 7/2017 | Lee .................. | H01L 27/3213 |

* cited by examiner

*Primary Examiner* — Thanh Y. Tran
(74) *Attorney, Agent, or Firm* — Morgan, Lewis & Bockius LLP (57) ABSTRACT

An organic light emitting display device includes a substrate; first and second organic light emitting diodes laterally shifted with respect to each other on the substrate; an encapsulation layer covering the first and second organic light emitting diodes, the encapsulation layer including a plurality of layers; and a first color filter and a second color filter each within the plurality of layers, the first color filter and the second color filter being respectively disposed over respective ones of the first and second organic light emitting diodes at respectively different heights from the substrate.

14 Claims, 7 Drawing Sheets

ORGANIC LIGHT EMITTING DISPLAY DEVICE

CROSS-REFERENCE TO RELATED APPLICATIONS

This application claims the benefit of the Korean Patent Application No. 10-2016-0143780 filed on Oct. 31, 2016, which is hereby incorporated by reference as if fully set forth herein.

BACKGROUND

Technical Field

The present disclosure relates to an organic light emitting display device.

Discussion of the Related Art

With the advancement of an information-oriented society, various requirements for display devices for displaying an image are increasing. Therefore, various display devices such as liquid crystal display (LCD) devices, plasma display panel (PDP) devices, organic light emitting display devices, etc., are recently being used.

As a type of display device, organic light emitting display devices are self-emitting display devices and have better viewing angle and contrast ratio than LCD devices. Also, because the organic light emitting display devices do not need a separate backlight, it is possible to reduce the weight and thickness of organic light emitting display devices. Further, the organic light emitting display devices are excellent in power consumption. Moreover, the organic light emitting display devices are driven with a low direct current (DC) voltage, have a fast response time, and are low in manufacturing cost.

Organic light emitting display devices emit light using an organic light emitting diode. The organic light emitting diode may include a red organic light emitting diode emitting red light, a green organic light emitting diode emitting green light, and a blue organic light emitting diode emitting blue light, or may include only a white organic light emitting diode emitting white light. If the organic light emitting diode includes only the white organic light emitting diode, red, green, and blue color filters for respectively realizing red, green, and blue are needed.

In a related art organic light emitting display device, in addition to a lower substrate on which an organic light emitting diode is provided, a color filter substrate is manufactured as a separate upper substrate, and the lower substrate is bonded to the color filter substrate. Therefore, in the related art organic light emitting display device, a cell gap between a color filter and the organic light emitting diode of a pixel P is relatively wide. Also, in a display device having a dense pixel interval and a super-high resolution, even though the color filter substrate and the lower substrate are mismatched only a little due to a process margin in a process of bonding the color filter substrate to the lower substrate, a position of a black matrix overlaps the organic light emitting diode, thereby degrading image quality.

SUMMARY

Accordingly, the present disclosure is directed to provide an organic light emitting display device that substantially obviates one or more problems due to limitations and disadvantages of the related art.

An aspect of the present disclosure is to provide an organic light emitting display device for preventing image quality from being degraded.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light emitting display device comprises a substrate; first and second organic light emitting diodes laterally shifted with respect to each other on the substrate; an encapsulation layer covering the first and second organic light emitting diodes, the encapsulation layer including a plurality of layers; and a first color filter and a second color filter each within the plurality of layers, the first color filter and the second color filter being respectively disposed over respective ones of the first and second organic light emitting diodes at respectively different heights from the substrate.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a," "an," and "the" are intended to include the plural forms as well, unless the context clearly indicates otherwise. The terms "first" and "second" are for differentiating one element from the other element, and these elements should not be limited by these terms. It will be further understood that the terms "comprises," "comprising," "has," "having," "includes," and/or "including," when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Hereinafter, exemplary embodiments of the present disclosure will be described in detail with reference to the accompanying drawings.

Figure 1:
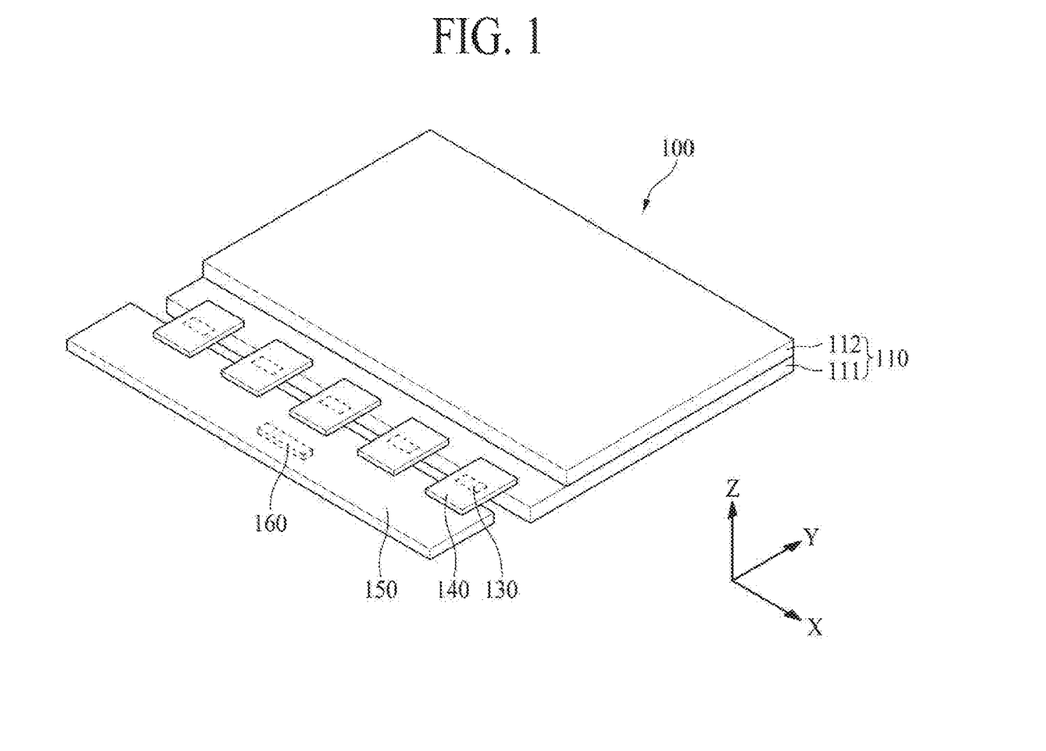
FIG. 1 is a perspective view illustrating an organic light emitting display device according to an embodiment of the present disclosure.
Figure 2:
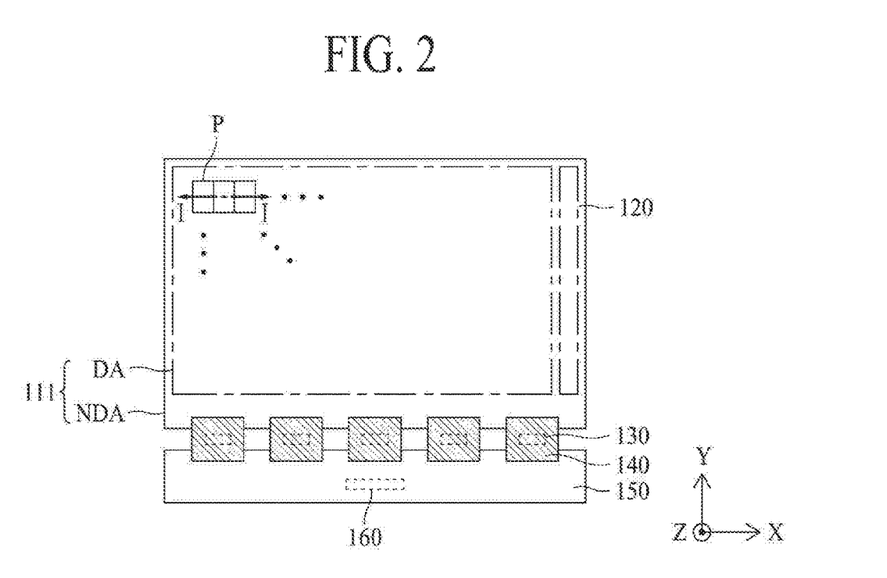
FIG. 2 is a plan view illustrating a first substrate, a gate driver, a source drive integrated circuit (IC), a flexible film, a circuit board, and a timing controller of FIG. 1.

FIG. 1 is a perspective view illustrating an organic light emitting display device 100 according to an embodiment of the present disclosure. FIG. 2 is a plan view illustrating a first substrate, a gate driver, a source drive integrated circuit (IC), a flexible film, a circuit board, and a timing controller of FIG. 1.

With reference to FIGS. 1 and 2, the organic light emitting display device 100 according to an embodiment of the present disclosure may include a display panel 110, a gate driver 120, a source drive IC 130, a flexible film 140, a circuit board 150, and a timing controller 160. The display panel 110 may include a first substrate 111 and a second substrate 112. The second substrate 112, if present, may be an encapsulation substrate but may be omitted.

A plurality of gate lines, a plurality of data lines, and a plurality of pixels P may be provided on one surface of the first substrate 111. The pixels P may be respectively provided in a plurality of areas defined by an intersection structure of the gate lines and the date lines.

Each of the pixels P may include a thin film transistor (TFT) and an organic light emitting diode that includes a first electrode, an organic light emitting layer, and a second electrode. When a gate signal is input through a gate line, each of the pixels P may supply a certain current to the organic light emitting diode using the TFT according to a data voltage supplied through a data line. Therefore, the organic light emitting diode of each of the pixels P may emit light having certain brightness according to the certain current. A structure of each of the pixels P will be described below in detail with reference to FIGS. 3 to 6.

The display panel 110, as illustrated in FIG. 2, may be divided into a display area DA, where the pixels are provided to display an image, and a non-display area NDA that does not display an image. The gate lines, the data lines, and the pixels P may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in-panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source drive IC 130 may receive digital video data and a source control signal from the timing controller 160. The source driver IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads using an anisotropic conductive film, and thus, the pads may be connected to the lines of the flexible film 140.

The circuit board 150 may be attached on the flexible film 140, which may be provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate a gate control signal for controlling an operation timing of the gate driver 120 and a source control signal for controlling the source drive IC 130, a plurality of which may be provided, based on the timing signal. The timing controller 160 may supply the gate control signal to the gate driver 120 and may supply the source control signal to the plurality of source drive ICs 130.

Figure 3:
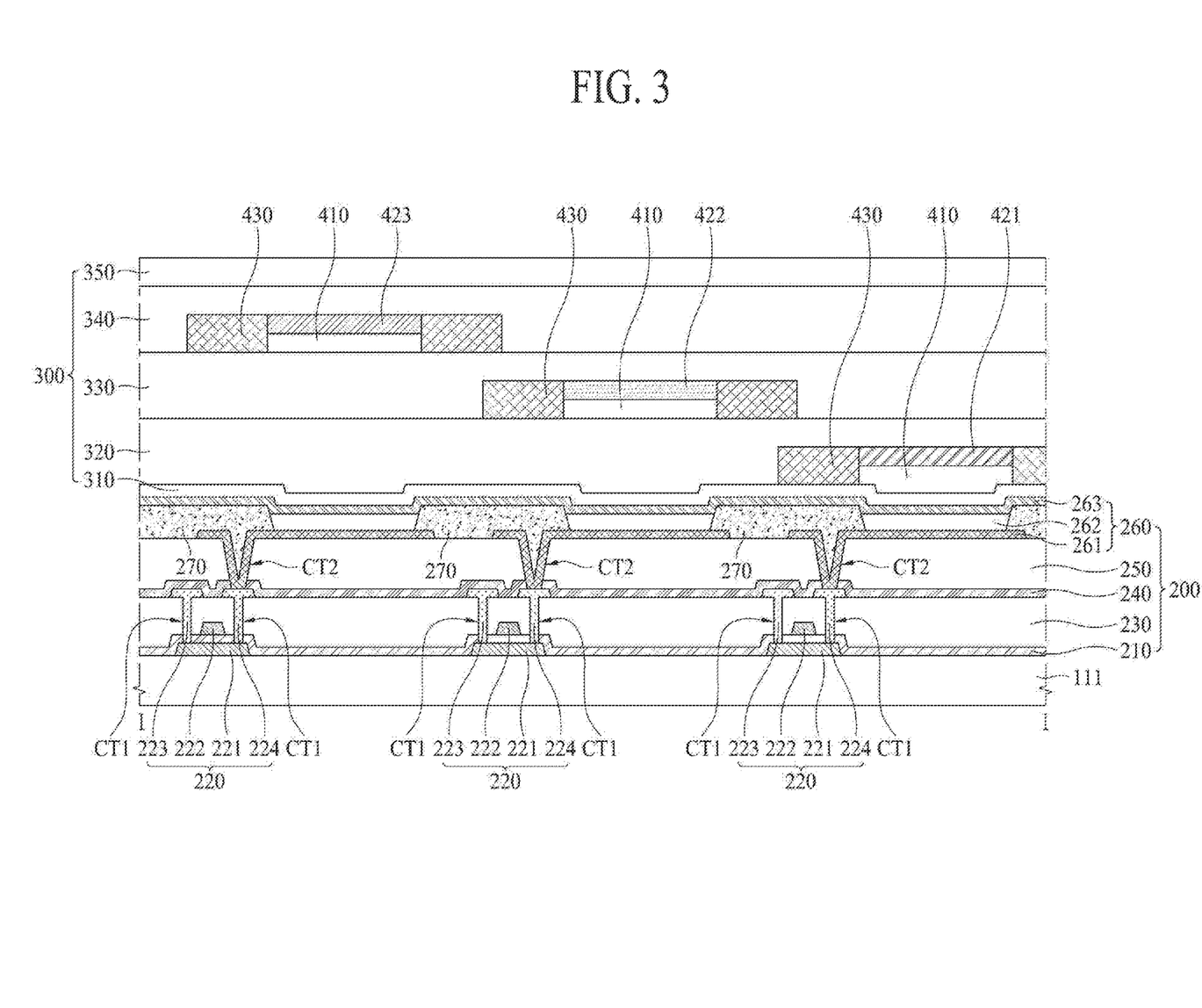
FIG. 3 is a cross-sectional view taken along line I-I of FIG. 2 and is a cross-sectional view of an organic light emitting display device according to a first embodiment of the present disclosure.

FIG. 3 is a cross-sectional view taken along line I-I of FIG. 2 and is a cross-sectional view of an organic light emitting display device according to a first embodiment of the present disclosure.

With reference to FIG. 3, the organic light emitting display device according to the first embodiment of the present disclosure may include a first substrate 111, a pixel array layer 200, an encapsulation layer 300, a semi-transmissive layer 410, a color filter 421 (or 422 or 423), and a black matrix 430.

The first substrate 111, as a base substrate, may include a plastic material, a glass material, and/or the like. The first substrate 111 according to an embodiment may include a flexible plastic material, and for example, may include opaque or colored polyimide (PI). The first substrate 111 according to an embodiment may be manufactured by curing polyimide resin that is coated on an upper surface of a release layer provided on a relatively thick carrier substrate to have a certain thickness. Here, the carrier substrate may be separated from the first substrate 111 by releasing the release layer through a laser release process.

Additionally, the organic light emitting display device according to an embodiment of the present disclosure may further include a back plate that is coupled to a bottom of the first substrate 111 with respect to a vertical axis direction (or a thickness direction of the first substrate 111). The back plate may include a plastic material, for example, polyethyleneterephthalate (PET). The back plate may be laminated on the bottom of the first substrate 111 separated from the carrier substrate, thereby maintaining the first substrate 110 in a planar state.

The pixel array layer 200 may include a plurality of pixels SP that are provided on the first substrate 111 to display an image. The pixel array layer 200 according to an embodiment of the present disclosure may include a gate insulation layer 210, a thin film transistor (TFT) 220, an interlayer dielectric 230, a passivation layer 240, a planarization layer 250, an organic light emitting diode 260, and a bank 270.

The TFT 220 may include an active layer 221, a gate electrode 222, a source electrode 223, and a drain electrode 224. The active layer 221 may be formed on the first substrate 111. The active layer 221 may be formed of a silicon-based semiconductor material or an oxide-based semiconductor material. A light blocking layer for blocking external light incident on the active layer 221 and a buffer layer for protecting the TFT 220 and the organic light emitting diode 260 from water may be additionally provided under the active layer 221.

The gate insulation layer 210 may be formed on the active layer 221. The gate insulation layer 220 may be formed of an inorganic layer, for example, silicon oxide (SiOx), silicon nitride (SiNx), or a multilayer thereof.

The gate electrode 222 may be disposed on the gate insulation layer 210. A gate line may be formed on the gate insulation layer 210. The gate electrode 222 and the gate line may each be formed of a single layer or a multilayer, which may include one of molybdenum (Mo), aluminum (Al), chromium (Cr), titanium (Ti), nickel (Ni), neodymium (Nd), and copper (Cu), or an alloy thereof. The interlayer dielectric 230 may be formed on the gate electrode 222. The interlayer dielectric 230 may be formed of an inorganic layer, for example, SiOx, SiNx, or a multilayer thereof.

The source electrode 223 and the drain electrode 224 may be disposed on the interlayer dielectric 230. A data line may be disposed on the interlayer dielectric 230. The source electrode 223 may contact the active layer 221 through a contact hole CT1 that passes through the gate insulation layer 210 and the interlayer dielectric 230. The drain electrode 224 may contact the active layer 221 through another contact hole CT1 that passes through the gate insulation layer 210 and the interlayer dielectric 230. The source electrode 223, the drain electrode 224, and the data line may each be formed of a single layer or a multilayer, which may include one of Mo, Al, Cr, Ti, Ni, Nd, and Cu, or an alloy thereof.

In FIG. 3, the TFT 220 is illustrated as having a top gate type where the gate electrode 222 is disposed on the active layer 221, but is not limited thereto. In other embodiments, the TFT 220 may be formed as a bottom gate type where the gate electrode 222 is disposed under the active layer 221 or a double gate type where the gate electrode 222 is disposed both on and under the active layer 221.

The passivation layer 240 may be disposed on the source electrode 223, the drain electrode 224, and the data line. The passivation layer 240 may insulate the TFT 220. The passivation layer 240 may be formed of an inorganic layer, for example, SiOx, SiNx, or a multilayer thereof.

The planarization layer 250 may be formed on the passivation layer 240. The planarization layer 250 may planarize a step height caused by the TFT 210 on the passivation layer 240. The passivation layer 250 may be formed of an organic layer, such as acryl resin, epoxy resin, phenolic resin, polyamide resin, polyimide resin, and/or the like.

The organic light emitting diode 260 and the bank 270 may be disposed on the planarization layer 250. The organic light emitting diode 260 may include a first electrode 261, an organic light emitting layer 262, and a second electrode 263. The first electrode 261 may be an anode electrode, and the second electrode 263 may be a cathode electrode.

The first electrode 261 may be disposed on the planarization layer 250. The first electrode 261 may be connected to the drain electrode 224 of the TFT 220 through a contact hole CT2 passing through the passivation layer 240 and the planarization layer 250. The first electrode 261 may be formed of a conductive material, which is high in reflectance, such as a stacked structure (Ti/Al/Ti) of Al and Ti, a stacked structure (ITO/Al/ITO) of Al and indium tin oxide (ITO), an APC alloy, a stacked structure (ITO/APC/ITO) of an APC alloy and ITO, and/or the like. The APC alloy may be an alloy of Ag, palladium (Pd), and Cu.

The bank 270 may be disposed on the planarization layer 250 to overlap the first electrode 261. The bank 270 may be disposed on the first electrode 261 in the contact hole CT2. An emissive area of the pixel may be defined as an area where the first electrode 261, the organic light emitting layer 262, and the second electrode 263 are sequentially stacked to emit certain light. In this case, the first electrode 261, the organic light emitting layer 262, and the second electrode 263 may be sequentially stacked in an area where the bank 270 is not provided. Therefore, the bank 270 may divide the emissive area and may define the emissive area.

The organic light emitting layer 262 may be disposed on the first electrode 261. The organic light emitting layer 262 may be a white light emitting layer that emits white light. In this case, the organic light emitting layer 262 may be formed in a tandem structure of two or more stacks. Each of the stacks may include a hole transporting layer, at least one light emitting layer, and an electron transporting layer. The organic light emitting layer 262 may be formed in a deposition process or a solution process, and in a case of being formed in the deposition process, the organic light emitting layer 262 may be formed in an evaporation deposition process.

The second electrode 263 may be disposed on the organic light emitting layer 262. The second electrode 263 may be disposed on the bank 270. The second electrode 263 may be formed of a transparent conductive material (TCO), such as indium tin oxide (ITO) or indium zinc oxide (IZO), capable of transmitting light, or a semi-transmissive conductive material, such as Mg, Ag, or an alloy of Mg and Ag. A capping layer may be disposed on the second electrode 263. The second electrode 263 may be formed through a physical vapor deposition (PVD) process, such as a sputtering process.

The encapsulation layer 300 may be disposed on the second electrode 263. The encapsulation layer 300 prevents oxygen or water from penetrating into the organic light emitting layer 262 and the second electrode 263. To this end, the encapsulation layer 300 may include a plurality of layers that includes at least one inorganic layer and at least one organic layer. The encapsulation layer 300 may be formed through a physical vapor deposition (PVD) process such as a sputtering process.

The encapsulation layer 300 according to the first embodiment may include a first inorganic layer 310, a first organic layer 320, a second inorganic layer 330, a second organic layer 340, and a third inorganic layer 350. In this case, the first inorganic layer 310 may be disposed on the second electrode 263 to cover the second electrode 263. The first organic layer 320 and the second organic layer 340 may be disposed on the first inorganic layer 310 and the second inorganic layer 330 to cover the first inorganic layer 310 and the second inorganic layer 330, respectively. To prevent particles from penetrating into the organic light emitting layer 262 and the second electrode 263 via the first inorganic layer 310 and the second inorganic layer 330, the first organic layer 320 and the second organic layer 340 may be formed to have a sufficient thickness to prevent the penetration of particles. The third inorganic layer 350 may be disposed on the second organic layer 340 to cover the second organic layer 340.

The first inorganic layer 310 may be disposed closest to the organic light emitting diode 260 and may be formed of an inorganic insulating material, which is capable of being deposited at a low temperature, such as nitride silicon (SiNx), oxide silicon (SiOx), oxynitride silicon (SiON), oxide aluminum ($Al_2O_3$), or the like. In this case, because the organic light emitting layer 262 may be vulnerable to high temperature, the first inorganic layer 310 may be formed by a low temperature process using a low temperature atmosphere, for example, 100 degrees C. or less. Accordingly, in the present embodiment, the organic light emitting layer 260 is prevented from being damaged by a high temperature atmosphere applied to a process chamber when forming the first inorganic layer 310.

The first organic layer 320 may be provided on the first substrate 111 to cover a whole upper surface of the first inorganic layer 310. The first organic layer 320 may relax a stress between layers caused by bending of the organic light emitting display device. The first organic layer 320 according to an embodiment may include an organic material such as benzocyclobutadiene (BCB), acryl, polyimide, silicon oxycarbon (SiOC), and/or the like.

The second inorganic layer 330 may be provided on the first substrate 111 to cover a whole upper surface of the first organic layer 320. The second inorganic layer 330 prevents water or oxygen from penetrating into the first organic layer 320 and the first inorganic layer 310 from the outside of the organic light emitting display device. The second inorganic layer 330 according to an embodiment may be formed of an inorganic insulating material, which is capable of being deposited at a low temperature, such as silicon nitride (SiNx), silicon oxide (SiOx), silicon oxynitride (SiON), aluminum oxide ($Al_2O_3$), or the like.

The second organic layer 340 may be provided on the first substrate 111 to cover a whole upper surface of the second inorganic layer 330. The second organic layer 340 may relax a stress between layers caused by bending of the organic light emitting display device. The second organic layer 340 according to an embodiment may include an organic material, such as benzocyclobutadiene (BCB), acryl, polyimide, silicon oxycarbon (SiOC), and/or the like.

The third inorganic layer 350 may be provided on the first substrate 111 to cover a whole upper surface of the second organic layer 340. The third inorganic layer 350 primarily prevents penetration of water or oxygen from the outside of the organic light emitting display device. The third inorganic layer 350 according to an embodiment may be formed of an inorganic insulating material, which is capable of being deposited at a low temperature, such as silicon nitride (SiNx), silicon oxide (SiOx), silicon oxynitride (SiON), aluminum oxide ($Al_2O_3$), or the like.

The semi-transmissive layer 410 may be disposed under the color filter 420, and in more detail, may be disposed on a lower surface of the color filter 420. The semi-transmissive layer 410 may be disposed to have the same length as that of the color filter 420 disposed on an upper surface thereof. The semi-transmissive layer 410 may be semi-transmissive and may provide an optical distance of a micro-cavity. In more detail, light emitted from the organic light emitting diode 260 may be transferred to the outside through the semi-transmissive layer 410, and because the semi-transmissive layer 410 is semi-transmissive, some of the light may again travel to the organic light emitting diode 260. Therefore, repetitive reflection may occur between the semi-transmissive layer 410 and the organic light emitting diode 260, and this may be referred to as a micro-cavity effect. That is, light may be repetitively reflected in a cavity between the semi-transmissive layer 410 and the organic light emitting diode 260, thereby increasing light efficiency.

The color filter 420 may be disposed between adjacent encapsulation layers 300 of a plurality of encapsulation layers 300. The color filter 420 according to an embodiment may include a first color filter 421, a second color filter 422, and a third color filter 423 that have different colors.

The first color filter 421 according to the first embodiment of the present disclosure may be disposed on the first inorganic layer 310 and may be disposed in the second organic layer 340 along with the semi-transmissive layer 410 and the black matrix 430. For example, the first color filter 421 may be a blue color filter.

The second color filter 422 according to the first embodiment of the present disclosure may be disposed on the first organic layer 320 and may be disposed in the second inorganic layer 330 along with the semi-transmissive layer 410 and the black matrix 430. For example, the second color filter 422 may be a green color filter.

The third color filter 423 according to the first embodiment of the present disclosure may be disposed on the second inorganic layer 330 and may be disposed in the second organic layer 340 along with the semi-transmissive layer 410 and the black matrix 430. For example, the third color filter 423 may be a red color filter.

If the color filter 420 is directly formed on the organic light emitting diode 260, a high temperature can affect the organic light emitting diode 260. Thus, a low temperature curing color filter may be used.

As described above, in the organic light emitting display device according to the first embodiment of the present disclosure, the first color filter 421, the second color filter 422, and the third color filter 423 may be disposed on different layers inside the encapsulation layer 300. Therefore, in the organic light emitting display device according to the first embodiment of the present disclosure, because the color filter 422 is disposed in the encapsulation layer 300 instead of on the encapsulation layer 300, a cell gap between the organic light emitting diode 260 and the color filter 420 is reduced. Also, because the color filters 420 are simultaneously formed in the encapsulation layer 300 without separately forming and bonding the color filters 420, a mismatch between the organic light emitting diode 260 and the color filter 420 caused by a process margin is prevented, thereby preventing image quality from being degraded.

Moreover, in the organic light emitting display device according to the first embodiment of the present disclosure, because the first color filter 421, the second color filter 422, and the third color filter 423 are disposed at different heights, the micro-cavity effect is obtained using a thickness difference between the color filters 420 having different colors. Accordingly, in the organic light emitting display device according to the first embodiment of the present disclosure, light efficiency is enhanced, and a width of the electroluminescent wavelength spectrum is reduced, thereby increasing color reproducibility.

The black matrix 430 may be disposed on both side surfaces of the semi-transmissive layer 410 and the color filter 420. The black matrix 430 may be disposed in a boundary between adjacent pixels P and may be disposed to overlap the bank 270. The black matrix 430 prevents light of each pixel P from being leaked to an adjacent pixel P and enables each pixel P to realize an accurate gray level. In this case, a plurality of black matrixes 430 according to the first embodiment of the present disclosure may be disposed on different layers, and vertically adjacent black matrixes 430 may overlap each other. Despite the vertically adjacent black matrixes 430 overlapping each other, an aperture ratio of each pixel P is not affected, and light is doubly prevented from being leaked to a side in an overlapping portion.

Figure 4:
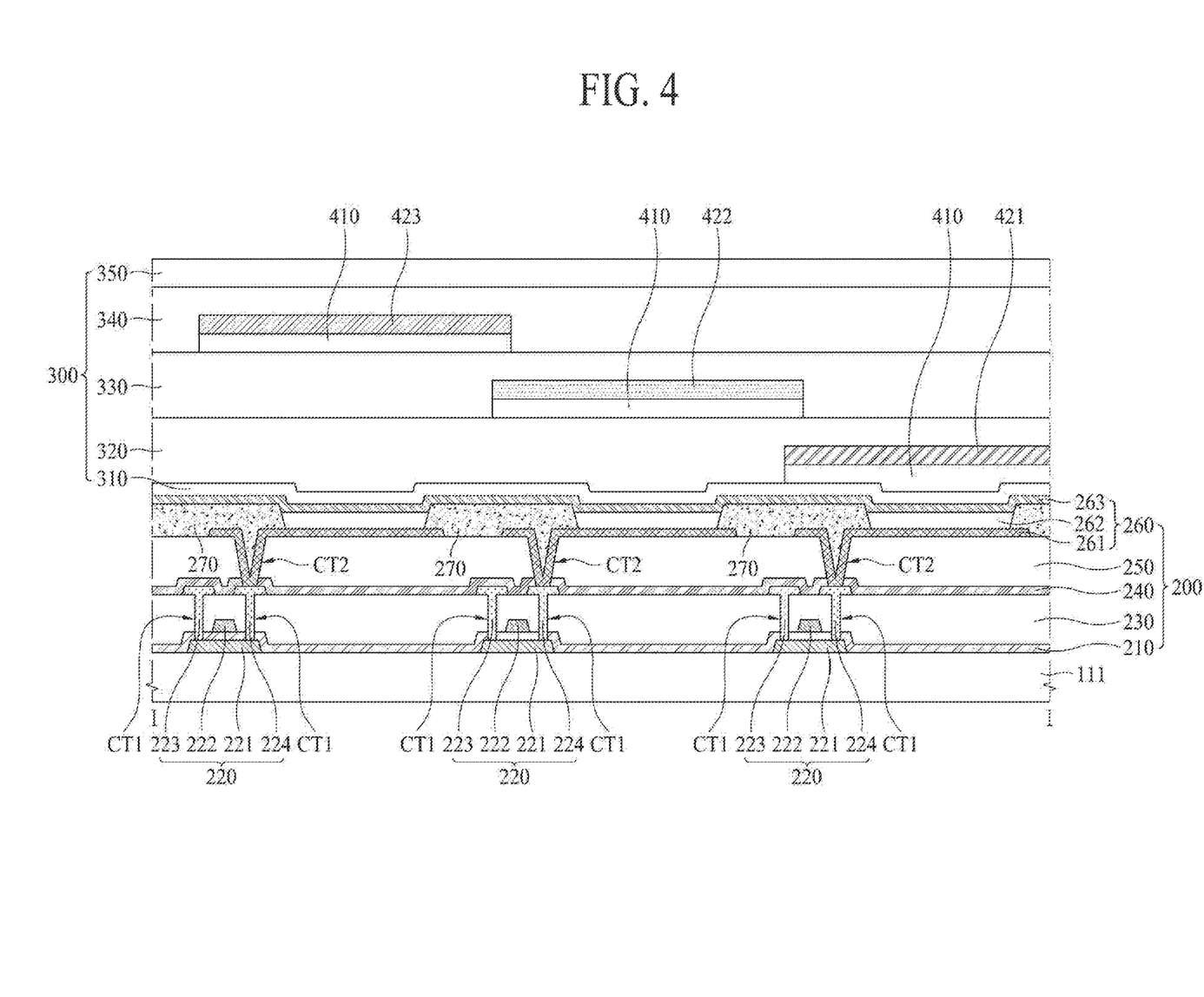
FIG. 4 is a cross-sectional view taken along line I-I of FIG. 2 and is a cross-sectional view of an organic light emitting display device according to a second embodiment of the present disclosure.

FIG. 4 is a cross-sectional view taken along line I-I of FIG. 2 and is a cross-sectional view of an organic light emitting display device according to a second embodiment of the present disclosure. Except that a black matrix 430 disposed on side surfaces of a color filter 420 and a semi-transmissive layer 410 is omitted, the organic light emitting display device illustrated in FIG. 4 is substantially the same as the organic light emitting display device described above with reference to FIGS. 1 to 3. Hereinafter, therefore, only the semi-transmissive layer 410 and the color filter 420 will be described with reference to FIG. 4, and repetitive descriptions of the other elements are omitted.

With reference to FIG. 4, a semi-transmissive layer 410 according to the second embodiment of the present disclosure may be disposed under a color filter 420, and in more detail, may be disposed on a lower surface of the color filter 420. The semi-transmissive layer 410 may be disposed to have the same length as that of the color filter 420 disposed on an upper surface thereof, or may be disposed to have a length that is longer or shorter than that of the color filter 420. The semi-transmissive layer 410 may have a semi-transmissive characteristic and may provide an optical distance of a micro-cavity. In more detail, light emitted from an organic light emitting diode 260 may be transferred to the outside through the semi-transmissive layer 410, and because the semi-transmissive layer 410 has the semi-transmissive characteristic, some of the light may again travel to the organic light emitting diode 260. Therefore, repetitive reflection may occur between the semi-transmissive layer 410 and the organic light emitting diode 260, and this may be referred to as a micro-cavity effect. That is, light may be repetitively reflected in a cavity between the semi-transmissive layer 410 and the organic light emitting diode 260, thereby increasing light efficiency.

The color filter 420 may be disposed between adjacent encapsulation layers 300 of a plurality of encapsulation layers 300. The color filter 420 according to an embodiment may include a first color filter 421, a second color filter 422, and a third color filter 423, which have different colors.

The first color filter 421 according to the second embodiment of the present disclosure may be disposed on a first inorganic layer 310 and may be disposed in a second organic layer 340 along with the semi-transmissive layer 410 and a black matrix 430. For example, the first color filter 421 may be a blue color filter.

The second color filter 422 according to the second embodiment of the present disclosure may be disposed on a first organic layer 320 and may be disposed in a second inorganic layer 330 along with the semi-transmissive layer 410 and the black matrix 430. For example, the second color filter 422 may be a green color filter.

The third color filter 423 according to the second embodiment of the present disclosure may be disposed on the second inorganic layer 330 and may be disposed in a second organic layer 340 along with the semi-transmissive layer 410 and the black matrix 430. For example, the third color filter 423 may be a red color filter.

If the color filter 420 is directly formed on the organic light emitting diode 260, a high temperature can affect the organic light emitting diode 260. Thus, a low temperature curing color filter may be used.

The color filter 420 of the organic light emitting display device according to the second embodiment of the present disclosure may be long enough to overlap the organic light emitting diode 260 and a bank 270 on both sides of organic light emitting diode 260. Therefore, in the organic light emitting display device according to the second embodiment of the present disclosure, ends of vertically adjacent color filters 420 may overlap each other. In more detail, one end of the first color filter 421 may overlap one end of the second color filter 422, and the other end of the second color filter 422 may overlap the other end of the third color filter 423. In the organic light emitting display device according to the second embodiment of the present disclosure, a cell gap may be narrow, and light cannot pass through a portion where the color filters 420 overlap each other. Accordingly, without a black matrix, light of each pixel P is prevented from being leaked to an adjacent pixel P, and each pixel P realizes an accurate gray level.

As described above, in the organic light emitting display device according to the second embodiment of the present disclosure, the first color filter 421, the second color filter 422, and the third color filter 423 may be disposed on different layers inside the encapsulation layer 300. Therefore, in the organic light emitting display device according to the second embodiment of the present disclosure, because the color filter 422 is disposed in the encapsulation layer 300 instead of on the encapsulation layer 300, a cell gap between the organic light emitting diode 260 and the color filter 420 is reduced. Also, because the color filters 420 are simultaneously formed in the encapsulation layer 300 without separately forming and bonding the color filters 420, a mismatch between the organic light emitting diode 260 and the color filter 420 caused by a process margin is prevented, thereby preventing image quality from being degraded.

Moreover, in the organic light emitting display device according to the second embodiment of the present disclosure, because the first color filter 421, the second color filter 422, and the third color filter 423 are disposed at different heights, the micro-cavity effect is obtained using a thickness difference between the color filters 420 having different colors. Accordingly, in the organic light emitting display device according to the second embodiment of the present disclosure, light efficiency is enhanced, and a width of the electroluminescent wavelength spectrum is reduced, thereby increasing color reproducibility.

Figure 5:
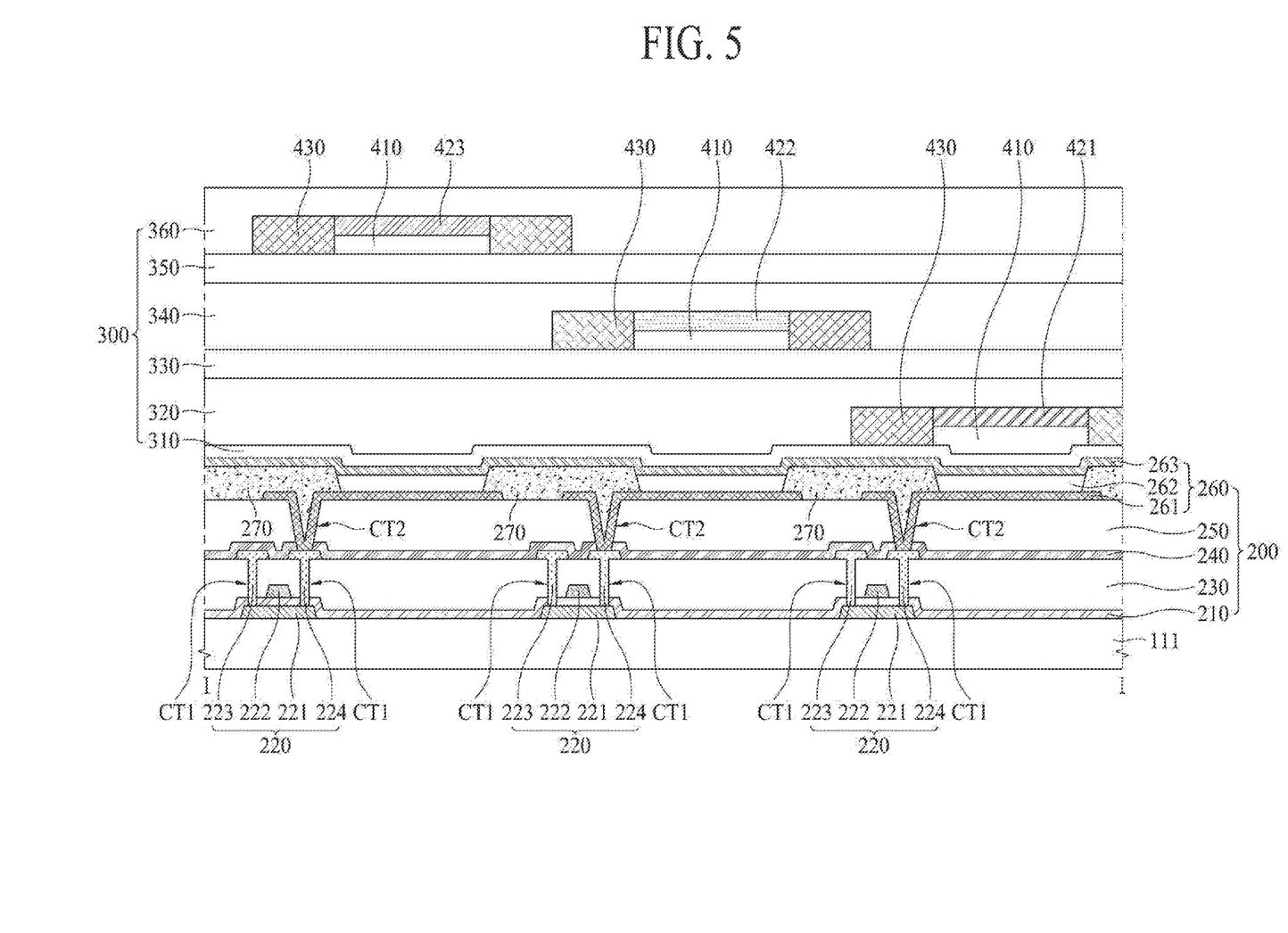
FIG. 5 is a cross-sectional view taken along line I-I of FIG. 2 and is a cross-sectional view of an organic light emitting display device according to a third embodiment of the present disclosure.

FIG. 5 is a cross-sectional view taken along line I-I of FIG. 2 and is a cross-sectional view of an organic light emitting display device according to a third embodiment of the present disclosure. Except that an encapsulation layer 300 on which a semi-transmissive layer 410, a color filter 420, and a black matrix 430 are disposed is modified, the organic light emitting display device illustrated in FIG. 5 is substantially the same as the organic light emitting display device described above with reference to FIGS. 1 to 3. Hereinafter, therefore, only the encapsulation layer 300, the semi-transmissive layer 410, and the color filter 420 will be described with reference to FIG. 5, and repetitive descriptions of the other elements are omitted.

With reference to FIG. 5, an encapsulation layer 300 of the organic light emitting display device according to the third embodiment of the present disclosure may include a first inorganic layer 310, a first organic layer 320, a second inorganic layer 330, a second organic layer 340, a third inorganic layer 350, and a third organic layer 360. In this case, the first inorganic layer 310 may be disposed on a second electrode 263 to cover the second electrode 263. The first organic layer 320 and the second organic layer 340 may be disposed on the first inorganic layer 310 and the second inorganic layer 330 to cover the first inorganic layer 310 and the second inorganic layer 330, respectively. To prevent particles from penetrating into an organic light emitting layer 262 and the second electrode 263 via the first inorganic layer 310 and the second inorganic layer 330, the first organic layer 320 and the second organic layer 340 may be formed with a sufficient thickness to prevent the penetration of particles. The third inorganic layer 350 may be disposed on the second organic layer 340 to cover the second organic layer 340. An encapsulation layer 300 of the organic light emitting display device according to the third embodiment of the present disclosure may further include the third organic layer 360 that is disposed on the third inorganic layer 350 to cover the third inorganic layer 350.

The semi-transmissive layer 410 and the color filter 420 may be disposed between adjacent encapsulation layers 300 of a plurality of encapsulation layers 300. The color filter 420 according to an embodiment may include a first color filter 421, a second color filter 422, and a third color filter 423, which have different colors.

The first color filter 421 according to the third embodiment of the present disclosure may be disposed on the first inorganic layer 310 and may be disposed in the second organic layer 340 along with the semi-transmissive layer 410 and the black matrix 430. For example, the first color filter 421 may be a blue color filter.

The second color filter 422 according to the third embodiment of the present disclosure may be disposed on the second inorganic layer 330 and may be disposed in the second organic layer 340 along with the semi-transmissive layer 410 and the black matrix 430. For example, the second color filter 422 may be a green color filter.

The third color filter 423 according to the third embodiment of the present disclosure may be disposed on the third inorganic layer 350 and may be disposed in the third organic layer 360 along with the semi-transmissive layer 410 and the black matrix 430. For example, the third color filter 423 may be a red color filter.

If the color filter 420 is directly formed on the organic light emitting diode 260, a high temperature can affect the organic light emitting diode 260. Thus, a low temperature curing color filter may be used.

As described above, in the organic light emitting display device according to the third embodiment of the present disclosure, the first color filter 421, the second color filter 422, and the third color filter 423 may be disposed on different layers inside the encapsulation layer 300. Therefore, in the organic light emitting display device according to the third embodiment of the present disclosure, because the color filter 422 is disposed in the encapsulation layer 300 instead of on the encapsulation layer 300, a cell gap between the organic light emitting diode 260 and the color filter 420 is reduced. Also, because the color filters 420 are simultaneously formed in the encapsulation layer 300 without separately forming and bonding the color filters 420, a mismatch between the organic light emitting diode 260 and the color filter 420 caused by a process margin is prevented, thereby preventing image quality from being degraded.

Moreover, in the organic light emitting display device according to the third embodiment of the present disclosure, because the first color filter 421, the second color filter 422, and the third color filter 423 are disposed at different heights, the micro-cavity effect is obtained using a thickness difference between the color filters 420 having different colors. Accordingly, in the organic light emitting display device according to the third embodiment of the present disclosure, light efficiency is enhanced, and a width of the electroluminescent wavelength spectrum is reduced, thereby increasing color reproducibility.

Figure 6:
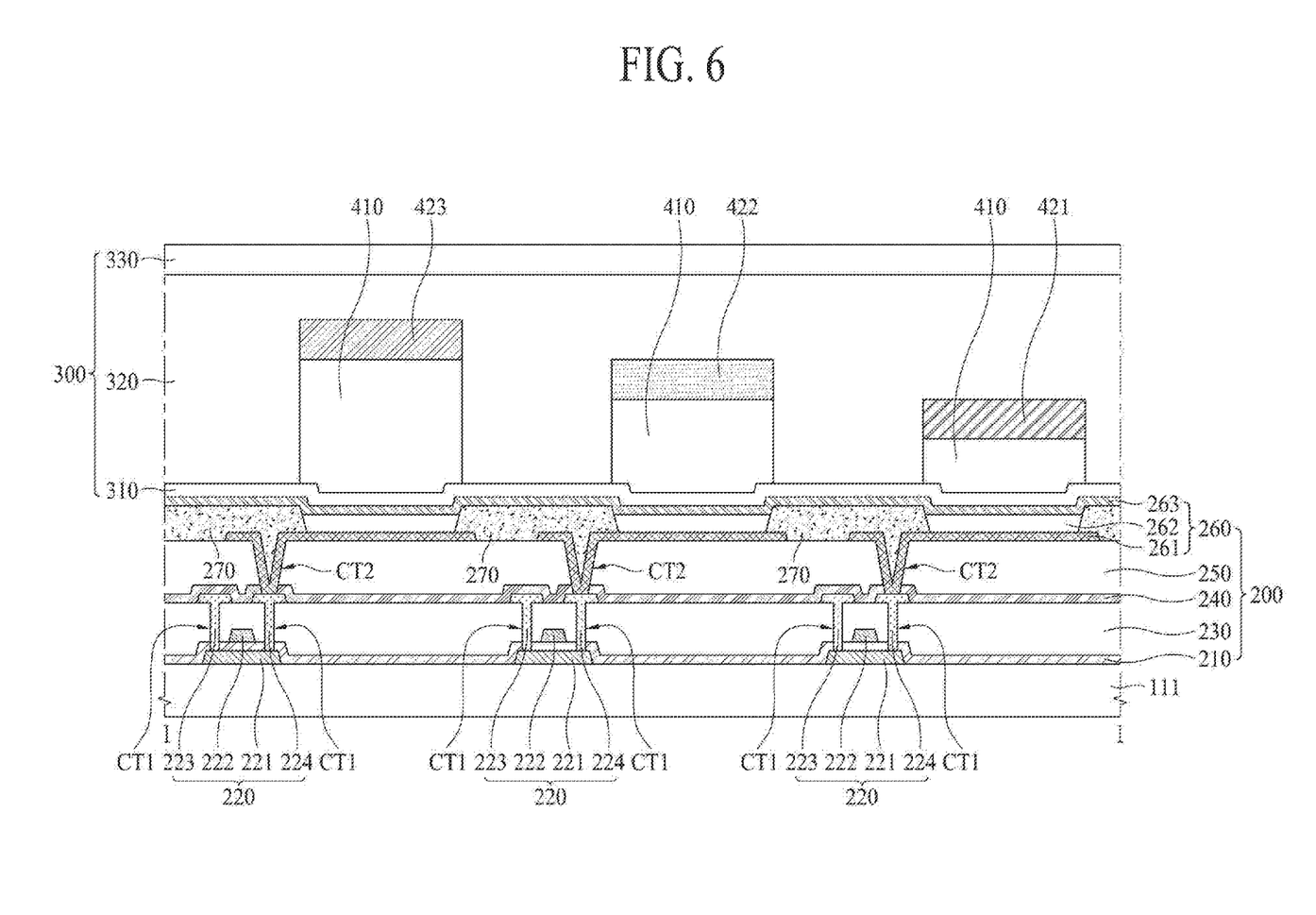
FIG. 6 is a cross-sectional view taken along line I-I of FIG. 2 and is a cross-sectional view of an organic light emitting display device according to a fourth embodiment of the present disclosure.

FIG. 6 is a cross-sectional view taken along line I-I of FIG. 2 and is a cross-sectional view of an organic light emitting display device according to a fourth embodiment of the present disclosure. Except that a black matrix 430 is omitted and an encapsulation layer 300 on which a semi-transmissive layer 410 and a color filter 420 are disposed is modified, the organic light emitting display device illustrated in FIG. 6 is substantially the same as the organic light emitting display device described above with reference to FIGS. 1 to 3. Hereinafter, only the encapsulation layer 300, the semi-transmissive layer 410, and the color filter 420 will be described with reference to FIG. 6, and repetitive descriptions of the other elements are omitted.

With reference to FIG. 6, an encapsulation layer 300 of the organic light emitting display device according to the fourth embodiment of the present disclosure may include a first inorganic layer 310, a first organic layer 320, and a second inorganic layer 330. In this case, the first inorganic layer 310 may be disposed on a second electrode 263 to cover the second electrode 263. The first organic layer 320 may be disposed on the first inorganic layer 310 to cover the first inorganic layer 310. To prevent particles from penetrating into an organic light emitting layer 262 and the second electrode 263 via the first inorganic layer 310, the first organic layer 320 may be formed with a sufficient thickness to prevent the penetration of particles.

The semi-transmissive layer 410 may be disposed under a color filter 420, and in more detail, may be disposed on a lower surface of the color filter 420. The semi-transmissive layer 410 may be disposed to have the same length as that of the color filter 420 disposed on an upper surface thereof, or may be disposed to have a length that is longer or shorter than that of the color filter 420.

The semi-transmissive layer 410 of the organic light emitting display device according to the fourth embodiment of the present disclosure may have a semi-transmissive characteristic and may be disposed to overlap lower surfaces of the color filters 420 having different colors at positions corresponding to different heights, thereby providing an optical distance of a micro-cavity. Light emitted from an organic light emitting diode 260 may be transferred to the outside through the semi-transmissive layer 410, and because the semi-transmissive layer 410 has the semi-transmissive characteristic, some of the light may again travel to the organic light emitting diode 260. Therefore, repetitive reflection may occur between the semi-transmissive layer 410 and the organic light emitting diode 260, which may be referred to as a micro-cavity effect. In this case, the semi-transmissive layer 410 of the organic light emitting display device according to the fourth embodiment of the present disclosure may have different heights depending on colors of the color filters 420 disposed on an upper surface. Because wavelengths of light emitted by colors of the color filters 420 differ, a thickness of a cavity defined as a distance between the semi-transmissive layer 410 and the organic light emitting diode 260 may be differently set. In more detail, a height of the semi-transmissive layer 410 disposed on a lower surface of the second color filter 422 emitting green light may be thinner than a thickness of the semi-transmissive layer 410 disposed on a lower surface of the third color filter 423 emitting red light having a long wavelength and may be thicker than a thickness of the semi-transmissive layer 410 disposed on a lower surface of the first color filter 421 emitting blue light having a shortest wavelength.

In the organic light emitting display device according to the fourth embodiment of the present disclosure, light may be repetitively reflected in a cavity between the semi-transmissive layer 410 and the organic light emitting diode 260, thereby increasing light efficiency.

The color filter 420 may be disposed between adjacent encapsulation layers 300 of a plurality of encapsulation layers 300. The color filter 420 according to an embodiment may include a first color filter 421, a second color filter 422, and a third color filter 423, which have different colors.

The first color filter 421, the second color filter 422, and the third color filter 423 according to the fourth embodiment of the present disclosure may be disposed on a first inorganic layer 310 and may be disposed in a second organic layer 320 along with the semi-transmissive layer 410. For example, the first color filter 421 may be a blue color filter, the second color filter 422 may be a green color filter, and the third color filter 423 may be a red color filter.

If the color filter 420 is directly formed on the organic light emitting diode 260, a high temperature can affect the organic light emitting diode 260. Thus, a low temperature curing color filter may be used.

As described above, in the organic light emitting display device according to the fourth embodiment of the present disclosure, the first color filter 421, the second color filter 422, and the third color filter 423 may be disposed inside the encapsulation layer 300 to have different heights. Therefore, in the organic light emitting display device according to the fourth embodiment of the present disclosure, because the color filter 422 is disposed in the encapsulation layer 300 instead of on the encapsulation layer 300, a cell gap between the organic light emitting diode 260 and the color filter 420 is reduced. Also, because the color filters 420 are simultaneously formed in the encapsulation layer 300 without separately forming and bonding the color filters 420, a mismatch between the organic light emitting diode 260 and the color filter 420 caused by a process margin is prevented, thereby preventing image quality from being degraded.

Moreover, in the organic light emitting display device according to the fourth embodiment of the present disclosure, because the first color filter 421, the second color filter 422, and the third color filter 423 are disposed at different heights, the micro-cavity effect is obtained using a thickness difference between the color filters 420 having different colors. Accordingly, in the organic light emitting display device according to the fourth embodiment of the present disclosure, light efficiency is enhanced, and a width of the electroluminescent wavelength spectrum is reduced, thereby increasing color reproducibility.

Figure 7:
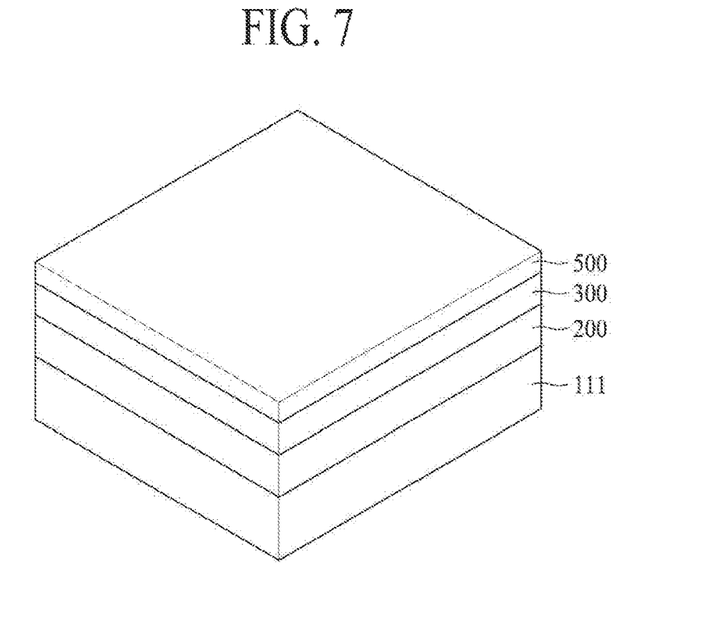
FIG. 7 is a perspective view of an organic light emitting display device according to an embodiment of the present disclosure where a touch sensing layer is additionally provided.
Figure 8:
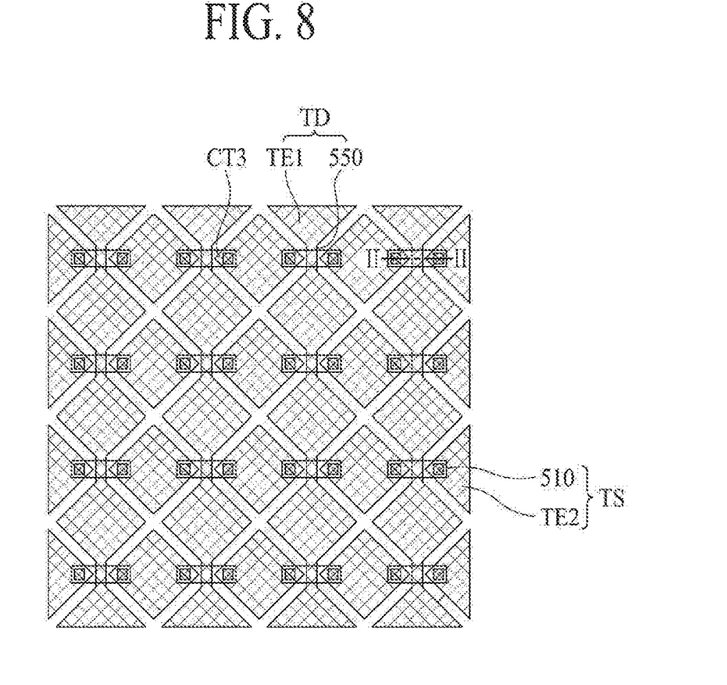
FIG. 8 is a plan view of a touch sensing layer according to an embodiment of the present disclosure.
Figure 9:
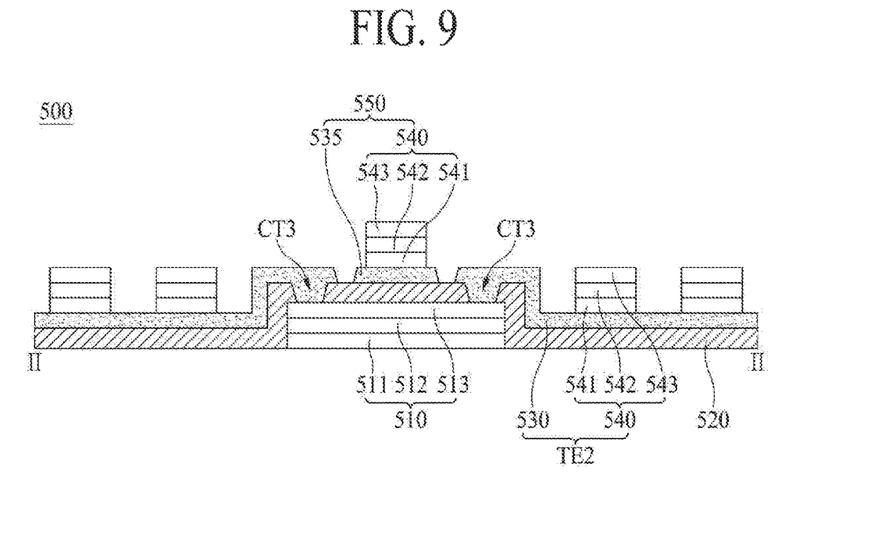
FIG. 9 is a cross-sectional view taken along line II-II of FIG. 8 and is a cross-sectional view of a touch sensing layer according to an embodiment of the present disclosure.

FIG. 7 is a perspective view of an organic light emitting display device according to an embodiment of the present disclosure where a touch sensing layer is additionally provided. FIG. 8 is a plan view of a touch sensing layer according to an embodiment of the present disclosure. FIG. 9 is a cross-sectional view taken along line II-II of FIG. 8 and is a cross-sectional view of a touch sensing layer according to an embodiment of the present disclosure.

With reference to FIGS. 7 to 9, a touch sensing layer 500 of the organic light emitting display device according to an embodiment of the present disclosure may include a second bridge 510, a touch insulation layer 520, a plurality of transparent conductive layers 530 and 535, a mesh metal layer 540, and a first bridge 550.

The second bridge 510 may be a bridge electrode that electrically connects adjacent second touch electrodes TE2. The second bridge 510 may be provided on a layer different from the second touch electrodes TE2 and may electrically connect two adjacent second touch electrodes TE2 that are separated from each other by the first bridge 550. In this case, the first bridge 550 and the second bridge 510 may be electrically disconnected from each other by the touch insulation layer 520.

The second bridge 510 may be electrically connected to the second touch electrodes TE2 through a contact hole CT3. In more detail, the second bridge 510 may be electrically connected to the transparent conductive layer 530 through the contact hole CT3 passing through the touch insulation layer 520. The second bridge 510 may be disposed to overlap a bank 270, thereby preventing an aperture ratio from being damaged by the second bridge 510.

The second bridge 510 may be directly provided on an upper surface of an encapsulation layer 300 and may include at least three metal layers. The second bridge 510 according to an embodiment of the present disclosure may include a touch reflection layer 511, a light path change layer 512, and a touch semi-transmissive layer 513.

The touch reflection layer 511 may be directly disposed on the upper surface of the encapsulation layer 300. The touch reflection layer 511 according to an embodiment may include MoTi or Mo. Because MoTi has a high adhesive force, MoTi prevents the touch reflection layer 511 from being stripped from the encapsulation layer 300. Furthermore, reflectance is low.

The light path change layer 512 may be disposed on the touch reflection layer 511. The light path change layer 512 according to an embodiment may include ITO or IZO, and moreover, may include $SiO_2$, $SiNx$, $Al_2O_3$, and/or the like.

The light path change layer 512 may be disposed between the touch reflection layer 511 and the touch semi-transmissive layer 513 to cause destructive interference based on a light path difference. In more detail, some of external light incident on the touch semi-transmissive layer 513 may be reflected as first reflection light by the light path change layer 512, and the other light of the external light that passes through the light path change layer 512 without being reflected by the light path change layer 512 may be reflected as second reflection light to the touch reflection layer 511 via the light path change layer 512. However, the first and second reflection lights are dissipated by the destructive interference. To this end, a thickness of the light path change layer 512 may be set in order for the first and second reflection lights to be dissipated by destructive interference caused by a phase difference.

Therefore, in the second bridge 510 according to an embodiment of the present disclosure, destructive interference occurs in external light incident by the light path change layer 512, and for this reason, reflectance is reduced. Accordingly, the organic light emitting display device according to an embodiment of the present disclosure prevents image visibility from being reduced at an outdoor place without a polarizer of the related art, thereby enhancing image quality.

The touch semi-transmissive layer 513 may be disposed on the light path change layer 512. The touch semi-transmissive layer 513 according to an embodiment may include MoTi or Mo. The touch semi-transmissive layer 513 according to an embodiment of the present disclosure may be formed of the same material as that of the touch reflection layer 511. In this case, a thickness of the touch semi-transmissive layer 513 may be set thinner than that of the touch reflection layer 511, and thus, the touch semi-transmissive layer 513 may semi-transmit external light incident thereon.

The touch insulation layer 520 may be provided on the encapsulation layer 300 to cover the second bridge 510. The touch insulation layer 520 may be formed of an organic material or an inorganic material. If the touch insulation layer 520 is formed of the organic material, the touch insulation layer 520 may be provided through a coating process of coating the organic material on the encapsulation layer 300 and a curing process of curing the coated organic material at a temperature of 100 degrees C. or less. If the touch insulation layer 520 is formed of the inorganic material, the touch insulation layer 520 may be formed of the inorganic material deposited on the encapsulation layer 300 through a low temperature chemical deposition process and a cleaning process that are alternately performed two times or more. Subsequently, the touch insulation layer 520 may be patterned through a photolithography process and an etching process, and thus, the contact hole CT3 may be formed.

The first bridge 550, the first touch electrodes TE1, and the second touch electrodes TE2 may be directly provided on an upper surface of the touch insulation layer 520. The first bridge 550 may overlap the second bridge 510. The first bridge 550 and the first and second touch electrodes TE1 and TE2 may include the transparent conductive layers 530 and 535 and the mesh metal layer 540.

The transparent conductive layers 530 and 535 may be disposed on the touch insulation layer 520. The transparent conductive layer 530 may be electrically connected to the second bridge 510 through the contact hole CT3 passing through the touch insulation layer 520.

The transparent conductive layers 530 and 535 according to an embodiment may each include an amorphous transparent conductive material, for example, amorphous ITO. For example, to prevent or minimize a damage of the pixel array layer 200 caused by a process temperature for forming the transparent conductive layers 530 and 535, the transparent conductive layers 530 and 535 may be formed of the amorphous transparent conductive material through a low temperature deposition process using a process temperature of 100 degrees C. or less. That is, if the transparent conductive layers 530 and 535 are formed of a crystalline transparent conductive material, the pixel array layer 200 may be damaged by a high temperature thermal treatment process used to obtain a low resistance value. Therefore, in the present embodiment, the transparent conductive layers 530 and 535 may be formed of the amorphous transparent conductive material through a low temperature metal deposition process.

The mesh metal layer 540 may be disposed on the transparent conductive layers 530 and 535. The mesh metal layer 540 may include at least three metal layers. The mesh metal layer 540 according to an embodiment of the present disclosure may include a touch reflection layer 541, a light path change layer 542, and a touch semi-transmissive layer 543.

The touch reflection layer 541 may be directly disposed on the transparent conductive layer 530. The touch reflection layer 541 according to an embodiment may include MoTi or Mo. MoTi is high in adhesive force and is low in reflectance.

The light path change layer 542 may be disposed on the touch reflection layer 541. The light path change layer 542 according to an embodiment may include ITO or IZO, and moreover, may include $SiO_2$, SiNx, $Al_2O_3$, and/or the like. The light path change layer 542 may be disposed between the touch reflection layer 541 and the touch semi-transmissive layer 543 to cause destructive interference based on a light path difference. Therefore, in the mesh metal layer 540 according to an embodiment of the present disclosure, destructive interference occurs in external light incident by the light path change layer 542, and for this reason, reflectance is reduced. Accordingly, the organic light emitting display device according to an embodiment of the present disclosure prevents image visibility from being reduced at an outdoor place without a polarizer of the related art, thereby enhancing image quality.

The touch semi-transmissive layer 543 may be disposed on the light path change layer 542. The touch semi-transmissive layer 543 according to an embodiment may include MoTi or Mo. The touch semi-transmissive layer 543 according to an embodiment of the present disclosure may be formed of the same material as that of the touch reflection layer 541. In this case, a thickness of the touch semi-transmissive layer 543 may be set thinner than that of the touch reflection layer 511, and thus, the touch semi-transmissive layer 543 may semi-transmit external light incident thereon.

The mesh metal layer 540, the first bridge 550, and the plurality of first and second touch electrode TE1 and TE2 including the mesh metal layer 540 may have a reflectance of about 10% with respect to external light incident thereon in a case where a thickness is 500 Å or more. Accordingly, using a low reflection metal layer stacking structure, the organic light emitting display device according to an embodiment of the present disclosure prevents reflection of external light without a polarizer, thereby reducing the manufacturing cost, preventing the loss of luminance caused by the polarizer, and enhancing image quality.

In the organic light emitting display device according to an embodiment of the present disclosure, the touch insulation layer 520 and the first and second touch electrodes TE1 and TE2 may be directly disposed on the upper surface of the encapsulation layer 300. Accordingly, in comparison with the related art organic light emitting display device where a touch screen is adhered to the organic light emitting display device by an adhesive, according to the present embodiment, an adhesive process is unnecessary, and thus, a manufacturing process is simplified and the manufacturing cost is reduced.

As described above, in the organic light emitting display device according to the embodiments of the present disclosure, because the color filter is disposed in the encapsulation layer, the cell gap between the organic light emitting diode and the color filter is reduced.

Moreover, in the organic light emitting display device according to the embodiments of the present disclosure, because the color filters are simultaneously formed in the encapsulation layer without performing separately forming and bonding the color filters, a mismatch between the organic light emitting diode, the color filter, and the black matrix caused by a process margin is prevented, thereby preventing image quality from being degraded.

Moreover, in the organic light emitting display device according to the embodiments of the present disclosure, because the first color filter, the second color filter, and the third color filter are disposed at different heights, the microcavity effect is obtained using a thickness difference between color filters having different colors.

Moreover, in the organic light emitting display device according to the embodiments of the present disclosure, light efficiency is enhanced, and a width of the electroluminescent wavelength spectrum is reduced, thereby increasing color reproducibility.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device, comprising:
   a substrate;
   first and second organic light emitting diodes laterally shifted with respect to each other on the substrate;
   an encapsulation layer covering the first and second organic light emitting diodes, the encapsulation layer including a plurality of layers;
   a first color filter and a second color filter each within the plurality of layers, the first color filter and the second color filter being respectively disposed over respective ones of the first and second organic light emitting diodes at respectively different heights from the substrate; and
   a plurality of semi-transmissive layers including semi-transmissive layers each respectively adjacent to lower surfaces of corresponding ones of the first and second color filters, and
   wherein the first and second color filters are disposed on different layers of the plurality of layers of the encapsulation layer.

2. The organic light emitting display device of claim 1, further comprising a third color filter over a third organic light emitting diode and laterally shifted with respect to the first color filter and the second color filter, the third color filter having a color different from colors of the first color filter and the second color filter,
   wherein each of the first to third color filters are disposed at respectively different heights from the substrate.

3. The organic light emitting display device of claim 2, wherein the plurality of semi-transmissive layers further includes a semi-transmissive layer adjacent to a lower surface of the third color filter, each semi-transmissive layer of the plurality of semi-transmissive layers having a different thickness.

4. The organic light emitting display device of claim 2, wherein ends of horizontally adjacent ones of the first, second, and third color filters overlap each other.

5. The organic light emitting display device of claim 2, wherein the first to third color filters are disposed on different layers of the plurality of layers of the encapsulation layer.

6. The organic light emitting display device of claim 5, wherein ends of adjacent ones of the first, second, and third color filters overlap each other.

7. The organic light emitting display device of claim 5, further comprising:
   a plurality of black matrixes at both side surfaces of the semi-transmissive layer and the first to third color filters.

8. The organic light emitting display device of claim 7, wherein adjacent ones of the black matrixes disposed on different layers overlap each other.

9. The organic light emitting display device of claim 1, wherein the plurality of layers of the encapsulation layer includes:
   a first inorganic layer on an upper surface of the first and second organic light emitting diodes;
   a first organic layer on the first inorganic layer; and
   a second inorganic layer on the first organic layer.

10. The organic light emitting display device of claim 1, further comprising a touch sensing layer directly provided on the encapsulation layer, the touch sensing layer including a plurality of first touch electrodes and a plurality of second touch electrodes.

11. The organic light emitting display device of claim 1, wherein ends of adjacent ones of the first and second color filters overlap each other.

12. The organic light emitting display device of claim 1, wherein ends of the first and second color filters overlap each other.

13. An organic light emitting display device, comprising:
   a substrate;
   first and second organic light emitting diodes laterally shifted with respect to each other on the substrate;
   an encapsulation layer covering the first and second organic light emitting diodes, the encapsulation layer including a plurality of layers;
   a first color filter and a second color filter each within the plurality of layers, the first color filter and the second color filter being respectively disposed over respective ones of the first and second organic light emitting diodes at respectively different heights from the substrate;
   a semi-transmissive layer adjacent to a lower surface of each of the first and second color filters; and
   a plurality of black matrixes at both side surfaces of the semi-transmissive layer and the first and second color filters,
   wherein the first and second color filters are disposed on different layers of the plurality of layers of the encapsulation layer.

14. The organic light emitting display device of claim 13, wherein adjacent ones of the black matrixes disposed on different layers overlap each other.

\* \* \* \* \*